United States Patent [19]

Frappe et al.

[11] Patent Number: 4,703,250
[45] Date of Patent: Oct. 27, 1987

[54] ELECTRIC SUPPLY

[75] Inventors: Gerard Frappe, Clamart; Patrice Ortalli, Elancourt, both of France

[73] Assignee: Thomson-CSF, Paris, France

[21] Appl. No.: 877,353

[22] Filed: Jun. 23, 1986

[30] Foreign Application Priority Data

Jun. 25, 1985 [FR] France ................................. 85 09652

[51] Int. Cl.⁴ .............................................. G05F 3/20
[52] U.S. Cl. .................................... 323/317; 323/351
[58] Field of Search ............... 323/315, 316, 317, 350, 323/351; 307/280, 300; 330/288

[56] References Cited

U.S. PATENT DOCUMENTS

| | | | |
|---|---|---|---|
| 3,622,865 | 11/1971 | Lee, Jr. ................................. | 323/351 |
| 3,813,561 | 5/1974 | Williams et al. ..................... | 307/263 |
| 3,898,552 | 8/1975 | Baker ................................... | 323/351 |
| 3,959,750 | 5/1976 | Holt ..................................... | 333/97 S |
| 4,323,796 | 4/1982 | Lathrope ........................... | 323/316 X |
| 4,354,122 | 10/1982 | Embree et al. ................. | 323/316 X |
| 4,429,270 | 1/1984 | Davies et al. ....................... | 323/317 |
| 4,458,201 | 7/1984 | Koen .................................. | 323/317 |
| 4,507,629 | 3/1985 | Frank ................................. | 333/164 |

FOREIGN PATENT DOCUMENTS 2644950 4/1977 Fed. Rep. of Germany .
2117914 7/1972 France .

OTHER PUBLICATIONS

Electronic Letters, vol. 18, No. 18, Sep. 1982, pp. 776-777, London, G.B.; B. L. Hart.
IEEE Transactions of Microwave Theory and Techniques, vol. MTT-22, No. 6, Jun. 1974, pp. 658-674, New York, US.

Primary Examiner—Peter S. Wong
Attorney, Agent, or Firm—Oblon, Fisher, Spivak, McClelland & Maier

[57] ABSTRACT

The electric supply allows a rapid switching of PIN diodes from their on state to their blocked state while limiting the electric power supplies required, and for that is used a current amplifying loop allowing upon order to bring almost instantaneously the current to the value desired, while maintaining a low consumption at rest, and it is particularly advantageous to associate this system to a low voltage generator allowing to eliminate the minority carriers, since in this case the high voltage generator allows blocking of the diode during longer rest times, and the invention is advantageously carried out in the form of an integrated circuit, the invention applying mainly to phase shifters for electronic scanning antennas with PIN diodes to the said antennas as well as to radars comprising the said antennas.

4 Claims, 3 Drawing Figures

ELECTRIC SUPPLY

BACKGROUND OF THE INVENTION

Field of the Invention

The main object of the present invention is to provide an electric power supply, for example an electric supply for a rapid switching device with PIN or power diodes.

Electronic scanning antennas or aerials comprise one or several primary radiation sources and a network of phase shifters associated with elementary sources. Phase shifters comprising PIN diodes are often used. The phase shifting is obtained either by carrying out a shifting between paths having different lengths, or by causing to vary the reactances of the PIN diodes, according to whether they are in their passing state or in their blocked state.

With an electric scanning antenna, the electromagnetic energy beams are directed, by forming an equiphase plane perpendicular to the direction of the beam. The spacial coverage of the beam is limited by the time required to change the phase shiftings of each elementary source of the antenna. An increase in the speed of phase shifting of the various elementary sources of the antenna allows for the tracking of a greater number of targets.

The transition, called switching between the nonconductive state and the conductive state of the phase shifting PIN diodes is performed rapidly. On the contrary, the inverted switching, in the non conductive direction is not performed instantaneously. Due to this fact, with a voltage source at the terminals of the PIN diodes at the moment of switching, each PIN diode starts to behave as a short-circuit where the reverse current becomes high, and is then blocked. At this moment when the polarity of the voltage applied to the junction of each PIN diode is reversed, the current in the diode increases rapidly. This reverse current is due to the shifting of the minority carriers, previously stored during the direct conduction period at the level of the junction. The quantity of the stored charges is a function of the characteristics of the diode, of the lifespan of the minority carriers and of the direct current prior to switching. The flow of these charges is ensured by blocking means that produce a reverse current achieved through elimination of the charge carriers. Thus, the switching rapidity is associated with the intensity of the current supplied by the blocking means.

According to the prior art, the blocking means that supply a reverse current once it is desired to establish the blocking of the diodes is constituted by a high voltage source having a large resistor. The high voltage supply is bulky and must supply a large current. Due to this fact, the feeding power is considerable and the thermal dissipation high. This results in temperature increases of the blocking device of the diodes.

SUMMARY OF THE INVENTION

The device according to the present invention allows to improve the switching of the phase shifting diodes from their ON state to their blocked state. Furthermore, the device according to the invention allows to reduce the electrical power required for the switching of the phase shifting diodes. The device according to the invention comprises an amplifying loop in which the current increases exponentially with time. Therefore, during switching periods, a very large current is almost instantaneously available. On the contrary, apart from the switching periods, the electrical consumption of the device according to the invention is considerably reduced.

Advantageously, the device according to the invention comprises a low voltage generator allowing the elimination of the minority carriers as well as a high voltage generator for inducing the PIN phase switching diodes into their final blocking state. High voltage generators comprise amplifying loops allowing the exponential rise of the current produced.

The main object of the invention is to produce an electric power supply, said supply comprising a reactive amplifying loop adapted to supply almost instantaneously on order the desired current while limiting the electrical consumption during rest.

BRIEF DESCRIPTION OF THE DRAWING

The present invention will become more apparent from the following description given by way of non-limitative example, with reference to the appended drawing in which.

On FIGS. 1 to 3 the same reference numerals have been used to designate the same elements.

DESCRIPTION OF THE PREFERRED EMBODIMENT

Figure 1:
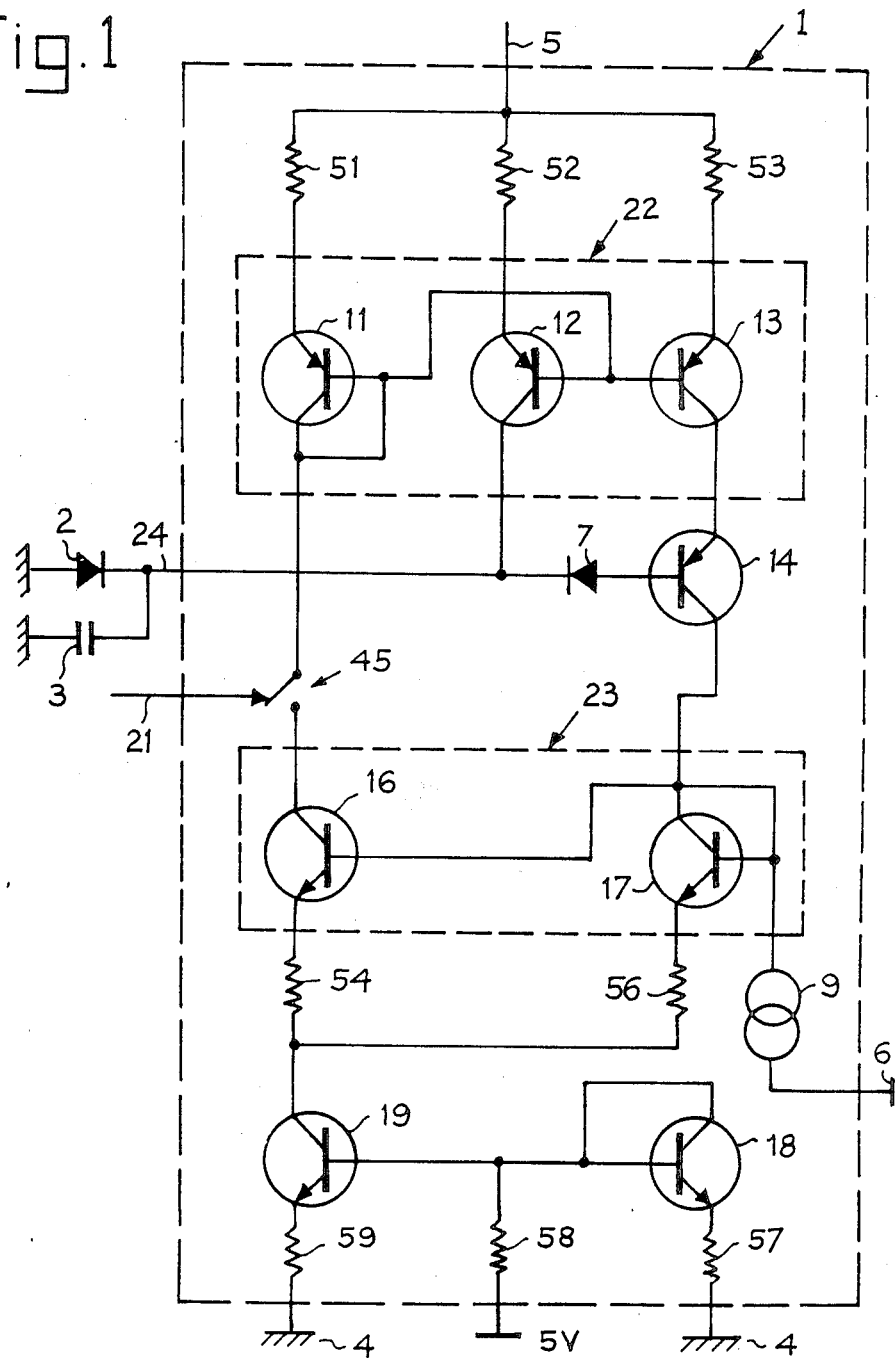
FIG. 1 is a diagram of an embodiment according to the invention comprising discrete elements.

FIG. 1 shows a first embodiment of the device according to the invention. The example illustrated is adapted to a realization comprising discrete electronic components. The embodiment illustrated in FIG. 1 of an electric current supply device 1 for switching a PIN diode 2 comprises four PNP transistors 11, 12, 13, 14, four NPN transistors 16, 17, 18 and 19, a diode 7, a current generator 9, eight resistors 51, 52, 53, 54, 56, 57, 58 and 59, and a switching device 45 which is for example a transistor. The connection 5 of the device 1 is fed in direct current, for example at a voltage of 40 volts. The emitters of transistors 11, 12 and 13 are connected to the output 5 respectively by the resistors 51, 52 and 53. The collector of the transistor 11 is connected to its base. The bases of transistors 11, 12 and 13 are electrically connected. The collector of transistor 13 is connected to the emitter of transistor 14. The base of transistor 14 is connected to the collector of transistor 12 through diode 7. The collector of transistor 12 is, on the other hand, connected to the output 24 of the supply device 1. The collector of transistor 11 is connected to the collector of transistor 16 through the switching device 45. The collector of transistor 14 is connected to the base of transistor 16 and to the base of transistor 17. The base of transistor 17 is connected to a current generator 9 supplied by an input 6 at, for example, a voltage of 5 volts. The emitters of transistors 16 and 17 are connected to the collector of transistor 19 respectively by resistors 54 and 56. The bases of transistors 19 and 18 are connected. The collector and the base of transistor 18 are connected. The emitter of transistor 19 is earthed at 4 through a resistor 59. The bases of transistors 18 and 19 are connected to a low voltage, for example 5 V, through a resistor 58; the emitter of transistor 18 is connected to the earth 4 through a resistor 57. The PIN switching diode 2 is supplied by the output 24 of the device 1. Advantageously, the uncoupling of the PIN diode 2 from the hyperfrequency field is ensured by a capacitor 3 mounted in parallel. The transistors 11, 12 and 13 form a first current mirror 22. Transistors 16 and 17 form a second current mirror 23.

Upon starting of the switching, switching device 45 is on. At this moment, the double current mirror 22 and 23 operates in amplifying loops. The current in the loop rises exponentially and almost instantaneously a high current required for the switching of the PIN diode 2 is available on the collector of transistor 12. The maximal current is limited by the pair of transistors 19 and 18. The current generator 9 ensures the current build-up at the current loop. The arrival of transistor 12 at a state close to saturation provokes blocking of transistor 14.

Transistors 16 and 17 are in the same state, i.e. R52, R53, R54, R56, respectively for the values of the resistors 52, 53, 54 and 56. The gain G of the amplification loop is equal to:

$$G = R51/R53 \times R56/R54$$

Figure 2:
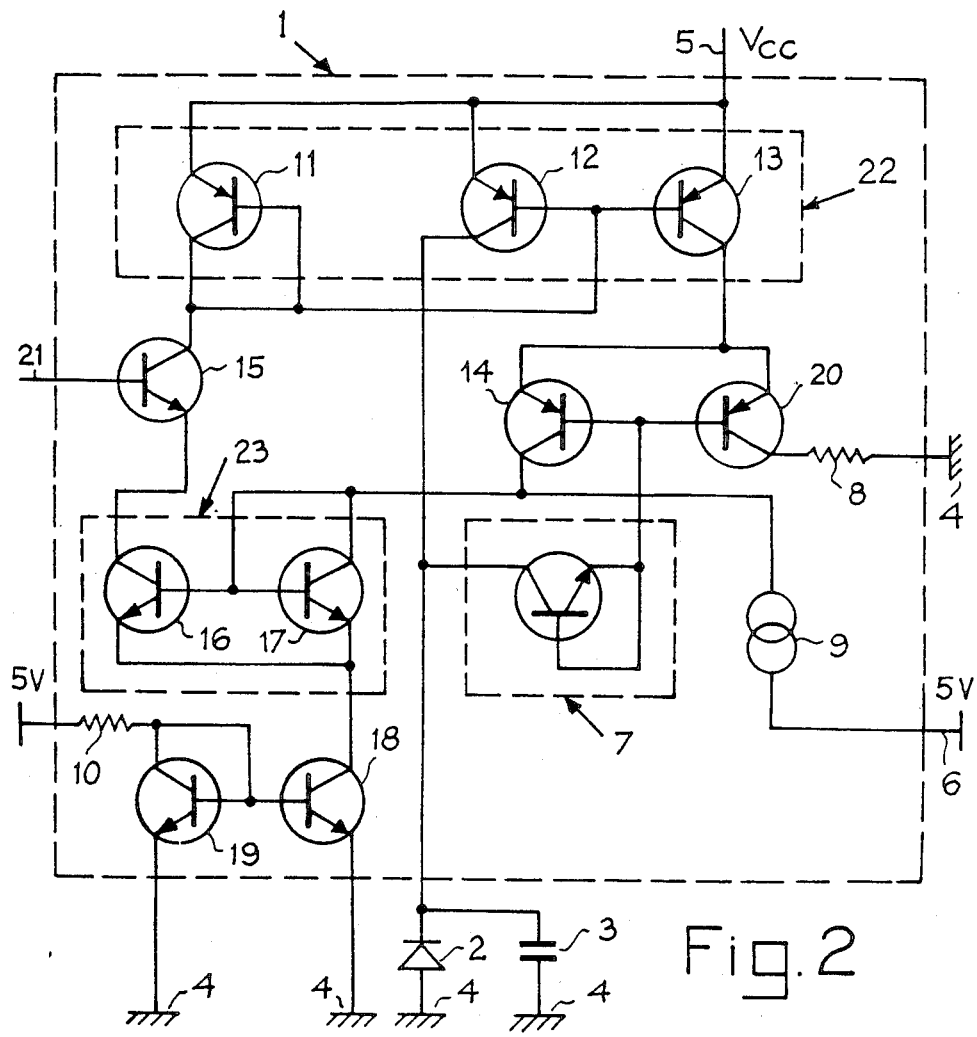
FIG. 2 is a diagram of a device according to the invention in the form of a monolithic circuit.

The device illustrated in FIG. 2, comprises five PNP transistors 11, 12, 13, 14 and 20, five NPN transistors 15, 16, 17, 18 and 19, a diode 7, a current generator 9 and two resistors 8 and 10. In one alternative embodiment, the diode 7 is replaced by a transistor the base and transmitter of which are connected.

FIG. 2 shows a diagram of an example of the device according to the invention that is particularly well adapted to the embodiment for example in the form of a monolithic circuit, in bipolar technology. The power supply 1 comprises a D.C. feed input 5 at a voltage of for example 40 volts. The input 5 is connected to the emitters of the three transistors 11, 12 and 13. The base of the transistor 11 is connected to its collector. The bases of the transistors 12 and 13 are connected, the collector of the transistor 13 is connected to the emitters of the transistors 14 and 20. The collector of the transistor 12 is connected, on the one hand, through a diode 7 to the bases of transistors 14 and 20 and, on the other hand, to the PIN diode 2 and to the capacitor 3 placed in parallel. The base of the transistor 11 is connected to the collector of the transistor 15. The transistor 15 is connected to a control input 21. The collector of the transistor 20 is earthed in 4 by a resistor 8. The collector of the transistor 14 is connected to a current generator 9, to the collector of the transistor 17 and to the bases of the transistors 17 and 16. The emitter of the transistor 15 is connected to the collector of the transistor 16. The current generator 9 is connected to a D.C. supply input 6 for example at a voltage of 5 volts. The emitters of transistors 16 and 17 are connected to the collector of the transistor 18. The bases of the transistors 18 and 19 are connected through a resistor 10 to a D.C. power input for example at a voltage of 5 volts. The base of transistor 19 is connected to its collector. The emitters of the transistors 18 and 19 are earthed at 4.

The device illustrated in FIG. 2 comprises two current mirrors 22 and 23. Their interconnection allows to obtain of an amplifying loop that upon starting presents an exponential increase of the current available at the output 24 of the device 1. The maximal current produced is limited by the couple of transistors 18 and 19. The arrival of transistor 12 close to its saturation zone provokes the blocking of transistor 14. The current generator 9 ensures the build-up at the amplifying loop. Starting is obtained by order upon the input 21 of transistor 15. Transistor 20 as well as resistor 8 allow to control the correct operating of the PIN diode 2. If diode 2 presents a leakage current it is impossible to raise it, to a blocking voltage of, for example, 40 volts. The detection of a diode presenting a leakage current can be carried out by measuring the voltage at the terminals of the resistor 8.

The device 1 illustrated in FIG. 2 is particularly well adapted to being produced in integrated circuit. The obtention of the monolithic device is rendered difficult through the appearance of stray transistors increasing the consumption of the said devices. The substrate of a monolithic circuit acts as a collector connected in parallel on a required PNP transistor.

The device according to the invention allows for the limiting of the stray current. Especially, the utilization of a low current I supplied by the generator 9 allows to minimize the electrical consumption at rest of the device. In a non-limitative example of the device according to the invention, the current I produced by the current generator 9 is equal to 10 $\mu$A.

Figure 3:
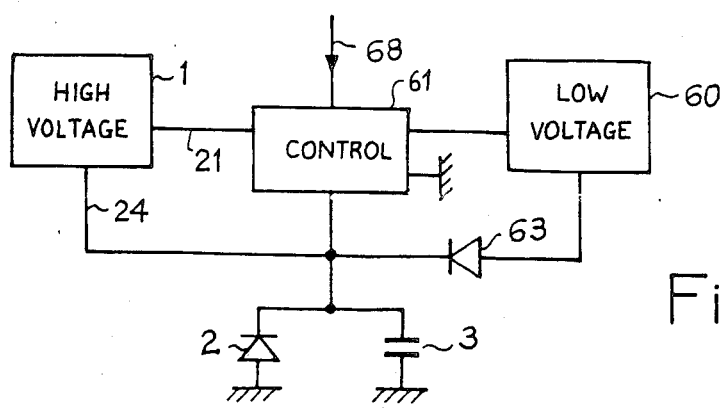
FIG. 3 is a general diagram of a device according to the invention associated with a PIN diode.

FIG. 3 represents a supply device of a switching PIN diode 2 utilizing the device according to the invention. As can be see, the switching of a PIN diode from its passing state to its blocked state requires eliminating minority carriers followed by the voltage rise at the junction of the diode up to the blocking voltage. The elimination of minority carriers requires a high current whereas the blocking of the diode requires a higher voltage, for example 40 volts. The device illustrated in FIG. 3 comprises a low voltage generator 60, a control circuit 61, a high voltage generator 1, a blocking diode 63. The high voltage generator 1 is identical to the device illustrated in FIGS. 1 or 2. In FIG. 3, are also illustrated the PIN diode 2 to be switched and mounted in parallel with a capacitor 3, as well as the arrival of the control signal 68 connected to the control circuit 61. The control circuit 61 is connected to the low voltage generator 60 as well as to the input 21 of the high voltage generator. The output of the low voltage generator is connected to the diode 2 and to the capacitor 3 through a diode 63, the high voltage generator 1 is connected to the diode 2, on the one hand, and to the capacitor 3, on the other hand. The control circuit is connected to the input of the diode 2, on the one hand, and to the earth, on the other hand. The control circuit 61 comprises means for measuring the voltage as well as comparators.

Firstly, the low voltage generator 60 produces a high current ensuring the elimination of the minority carriers. When the voltage at the terminals of the diode 2 is raised, once the minority carriers have been eliminated, the control circuit 61 activates the feed circuit 1 supplying a high voltage necessary for blocking the diode. The high voltage polarizes the diode 63 insulating the low voltage generator 60 from the high voltage generator 1.

The use of a low voltage generator allows to utilize the high voltage generator during a shorter time period. Therefore, it is particularly advantageous to reduce the consumption at rest of the circuit of the high voltage generator 1.

It is well understood that the device of FIG. 3 is associated to each PIN diode of each phase shifting device of the antenna.

The invention can be applied in particular to radars comprising electronic scanning antennas.

We claim:

1. An electrical power supply for providing power to a rapid switching device comprising:
   a current supply mens;
   a switching initiation means;
   a first current control means;
   a second current control means responsive to said switch initiation means and said supply means wherein said second current means is connected to said first current means to form two current mirror circuit devices and wherein said current mirror circuit devices form an amplifying loop which, upon initiation of said current initiation means, provides a substantially instantaneous desired current to said rapid switching device and wherein the electrical consumption of said supply is minimized when said desired current is not supplied.

2. The power supply according to claim 1 further comprising a transistor means for limiting the current in said amplifying loop.

3. The power supply according to claim 1 further comprising a means for detecting leakage current from said rapid switching device wherein said means for detecting includes a transistor means which supplies a resistor means with a voltage proportional to the voltage present at the terminals of said rapid switching device.

4. The supply according to claim 1 wherein said rapid switching device is a PIN diode and wherein said device further comprises a low voltage supply means connected to said diode for eliminating minority carriers.

* * * * *